(12) United States Patent
Won et al.

(10) Patent No.: US 9,111,994 B2
(45) Date of Patent: Aug. 18, 2015

(54) SEMICONDUCTOR DEVICE AND METHOD OF FABRICATING THE SAME

(75) Inventors: Yong-sik Won, Cheongju-si (KR); Sang-uk Lee, Cheonju-si (KR)

(73) Assignee: MAGNACHIP SEMICONDUCTOR, LTD., Cheongju-si (KR)

( * ) Notice: Subject to any disclaimer, the term of this patent is extended or adjusted under 35 U.S.C. 154(b) by 632 days.

(21) Appl. No.: 13/193,679

(22) Filed: Jul. 29, 2011

(65) Prior Publication Data

US 2012/0104564 A1 May 3, 2012

(30) Foreign Application Priority Data

Nov. 1, 2010 (KR) .......................... 10-2010-0107704
Dec. 3, 2010 (KR) .......................... 10-2010-0122773

(51) Int. Cl.
*H01L 21/76* (2006.01)
*H01L 21/762* (2006.01)
*H01L 21/308* (2006.01)

(52) U.S. Cl.
CPC ........ *H01L 21/76232* (2013.01); *H01L 21/308* (2013.01); *H01L 21/76229* (2013.01)

(58) Field of Classification Search
CPC .................................................. H01L 21/76229
USPC .......... 438/424, 427, 435; 257/622, E21.548, 257/506, 510
See application file for complete search history.

(56) References Cited

U.S. PATENT DOCUMENTS

| | | | | |
|---|---|---|---|---|
| 5,340,769 A | * | 8/1994 | Miyamoto | 438/296 |
| 5,418,095 A | * | 5/1995 | Vasudev et al. | 430/5 |
| 6,040,231 A | * | 3/2000 | Wu | 438/424 |
| 6,110,797 A | | 8/2000 | Perry et al. | |
| 6,165,871 A | * | 12/2000 | Lim et al. | 438/437 |
| 6,358,785 B1 | * | 3/2002 | Chittipeddi et al. | 438/174 |
| 6,589,868 B2 | * | 7/2003 | Rossman | 438/680 |
| 6,727,150 B2 | * | 4/2004 | Tang | 438/296 |
| 7,135,380 B2 | * | 11/2006 | Onai et al. | 438/430 |

FOREIGN PATENT DOCUMENTS

CN        1701418 A        11/2005

OTHER PUBLICATIONS

Chinese Office Action issued Sep. 2, 2014 in counterpart Chinese Application No. 201110272295.4 (26 pages, in Chinese, with English language translation).

* cited by examiner

*Primary Examiner* — Jerome Jackson, Jr.
*Assistant Examiner* — John Lin
(74) *Attorney, Agent, or Firm* — NSIP Law

(57) ABSTRACT

A semiconductor device and a method of fabricating the same are provided. The semiconductor device includes a semiconductor substrate in which a multi-depth trench is formed, the multi-depth trench including a shallow trench and a deep trench arranged below the shallow trench, a first dielectric material formed in partial area of the multi-depth trench, the first dielectric material including a slope in the shallow trench that extends upward from a corner where a bottom plane of the shallow trench and a sidewall of the deep trench meets, the slope being inclined with respect to the bottom plane of the shallow trench, and a second dielectric material formed in areas of the multi-depth trench in which the first dielectric material is absent.

13 Claims, 23 Drawing Sheets

SEMICONDUCTOR DEVICE AND METHOD OF FABRICATING THE SAME

CROSS-REFERENCE TO RELATED APPLICATIONS

This application claims the benefit under 35 U.S.C. §119(a) of Korean Patent Application No. 10-2010-0107704, filed on Nov. 1, 2010 and Korean Patent Application No. 10-2010-0122773, filed on Dec. 3, 2010, in the Korean Intellectual Property Office, the entire disclosure of which is incorporated herein by reference for all purposes.

BACKGROUND

1. Field

The following description relates to a semiconductor device and a method of fabricating the same, and more particularly, to a semiconductor device in which a multi-depth trench with shallow trench depth and deep trench depth is formed in an element isolating region (inactive region) and a method for fabricating the same.

2. Description of Related Art

In general, trench isolation is one technique used to electrically separate active regions of a semiconductor device by forming trenches in an element isolating region (inactive region) and filling in dielectric material as an insulating material therein.

The trench isolation method involves a formation of shallow trench in an element isolating region of a low voltage-device and a formation of a deep trench with relatively deeper depth in an element isolating region of a high voltage-device.

With respect to a semiconductor device of high integrity (e.g., less than 0.25 μm techniques), a multi-depth trench can be applied, which includes an overlapped shallow trench and a deep trench.

In order to form a multi-depth trench, a shallow trench can be formed first. Then, formation of a deep trench from the lower portion of the shallow trench follows. In this case, however, undercut or undesirable roughness may appear due to excessive etching on the upper portion of the deep trench.

Further, a first and a second photosensitive film can also be applied to form deep and shallow trenches of the multi-depth trench. However, since a portion of the second photosensitive film, which is coated on the multi-depth trench, resides on the bottom of the deep trench, a notch can be generated around the bottom of the deep trench.

Further, dielectric material can be excessively deposited around the boundary between the deep and shallow trenches in the process of filling in dielectric material within the multi-depth trench, resulting in a generation of a void within the shallow trench.

The problems such as undercut, undesirable roughness, notch or void as mentioned above can affect the properties of the semiconductor device by affecting the stability of the semiconductor device.

SUMMARY

In one general aspect, there is provided a semiconductor device, including a semiconductor substrate in which a multi-depth trench is formed, the multi-depth trench including a shallow trench and a deep trench arranged below the shallow trench, a first dielectric material formed in partial area of the multi-depth trench, the first dielectric material including a slope in the shallow trench that extends upward from a corner where a bottom plane of the shallow trench and a sidewall of the deep trench meets, the slope being inclined with respect to the bottom plane of the shallow trench, and a second dielectric material formed in areas of the multi-depth trench in which the first dielectric material is absent.

The general aspect of the semiconductor device may further provide that the slope has an angle ranging between 30° and 80° with respect to the bottom plane of the shallow trench.

The general aspect of the semiconductor device may further provide that the first dielectric material and the second dielectric material are silicon oxide.

The general aspect of the semiconductor device may further provide that the first dielectric material is deposited by high density plasma chemical vapor deposition (HDP CVD), and the second dielectric material is deposited by low pressure chemical vapor deposition (LP CVD).

The general aspect of the semiconductor device may further provide that the deep trench has a constant width.

The general aspect of the semiconductor device may further provide that the deep trench is one of a pair of deep trenches formed at intervals, the deep trench having a width and a depth that is equal to a width and a depth of an other one of the pair of deep trenches.

The general aspect of the semiconductor device may further provide that the deep trench is one of three deep trenches formed at intervals.

The general aspect of the semiconductor device may further provide that the deep trench is arranged a middle of the three deep trenches and between two side deep trenches of the three deep trenches, and the deep trench has a depth that is greater than depths of the two side deep trenches.

The general aspect of the semiconductor device may further provide that the deep trench is a first deep trench portion of a pair of deep trench portions, a second deep trench portion having a depth that is less than a depth of the first deep trench portion, a step being formed in a boundary between the first deep trench portion and the second deep trench portion.

In another general aspect, there is provided a method of fabricating a semiconductor device, the method including forming a multi-depth trench in a semiconductor substrate, the forming of the multi-depth trench including forming a shallow trench, and forming a deep trench arranged below the shallow trench, charging a first dielectric material into a partial area of the multi-depth trench, the first dielectric material including a slope in the shallow trench that extends upward from a corner where a bottom plane of the shallow trench and a sidewall of the deep trench meets, the slope being inclined with respect to the bottom plane of the shallow trench, and charging a second dielectric material into areas of the multi-depth trench in which the first dielectric material is absent.

The general aspect of the method may further provide planarizing an upper surface of the second dielectric material using chemical mechanical planarization (CMP).

The general aspect of the method may further provide that the slope has an angle ranging between 30° and 80° with respect to the bottom plane of the shallow trench.

The general aspect of the method may further provide that the first dielectric material is deposited by high density plasma chemical vapor deposition (HDP CVD) in the charging of the first dielectric material, and the second dielectric material is deposited by low pressure chemical vapor deposition (LP CVD) in the charging of the second dielectric material.

The general aspect of the method may further provide that the first dielectric material and the second dielectric material are silicon oxide.

The general aspect of the method may further provide that the forming of the multi-depth trench further includes forming a first hard mask layer on a surface of the semiconductor substrate, the forming of the first hard mask layer including forming a pad oxide layer on the surface of the semiconductor substrate, and forming a pad nitride layer on the pad oxide layer, forming a second through hole, including etching the first hard mask layer, forming the deep trench, including first etching the semiconductor substrate, and forming the shallow trench, including second etching the semiconductor substrate according to the second through hole.

The general aspect of the method may further provide that the forming of the second through hole further includes forming a first photosensitive layer on the first hard mask layer, forming a first through hole in the first photosensitive layer using a photolithographic process, performing the etching of the first hard mask layer according to the first through hole to form the second through hole, and removing the first photosensitive layer.

The general aspect of the method may further provide that the forming of the deep trench further includes depositing a second hard mask layer on the first hard mask layer, coating a second photosensitive layer on the second hard mask layer, forming a third through hole in the second photosensitive layer using a photolithographic process, performing the first etching of the semiconductor substrate according to the third through hole to form the deep trench, and removing the second photosensitive layer and the second hard mask layer in sequence.

The general aspect of the method may further provide that the second hard mask layer is a silicon oxide layer.

The general aspect of the method may further provide that the first dielectric material and the second dielectric material is charged into the multi-depth trench by chemical vapor deposition (CVD), the first dielectric material is charged by repeating a first deposition process and a first etching process, and the second dielectric material is charged only by a second deposition process.

The general aspect of the method may further provide that the first deposition process is carried out by high density plasma (HDP) CVD using monosilane ($SiH_4$) and oxygen ($O_2$) gases.

The general aspect of the method may further provide that the first etching process is carried out by an argon sputtering process.

Other features and aspects may be apparent from the following detailed description, the drawings, and the claims.

Figure 1:
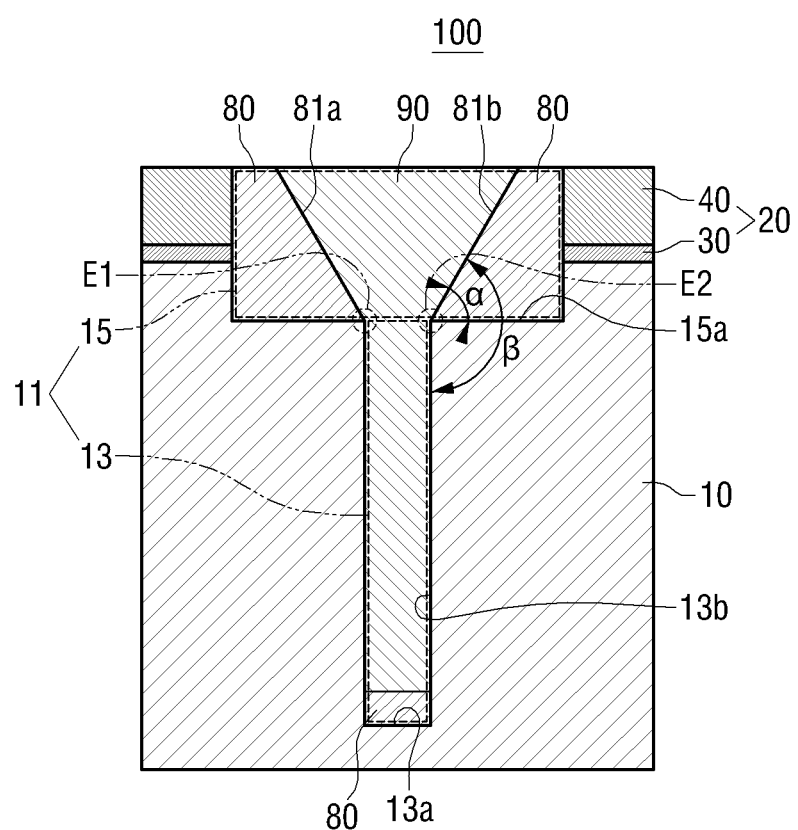
FIG. 1 is a schematic cross-sectional view illustrating an example of a semiconductor device.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

It is understood that the features of the present disclosure may be embodied in different forms and should not be constructed as limited to the examples set forth herein. Rather, examples are provided so that this disclosure will be thorough and complete, and will convey the full scope of the present disclosure to those skilled in the art. The drawings may not necessarily be to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

First, a semiconductor device 100 will be described. FIG. 1 is a schematic cross-sectional view illustrating an example of the semiconductor device 100. For example, the semiconductor device 100 of FIG. 1 represents an inactive region (or element isolating region) of a semiconductor device which is formed between active regions of the semiconductor device. Referring to FIG. 1, the semiconductor device 100 includes, but is not limited to, a semiconductor substrate 10 in which a multi-depth trench 11 is formed, with first and second dielectric materials 80, 90 that are filled in the multi-depth trench 11.

The semiconductor substrate 10 is a silicon substrate, in which a T-shaped multi-depth trench 11 is formed. The multi-depth trench 11 includes a deep trench 13 formed in a lower portion and a shallow trench 15 formed above the deep trench 13. Referring to FIG. 1, the deep trench 13 extends from a center portion of a bottom plane 15a of the shallow trench 15 deep into the semiconductor substrate 10. Accordingly, the deep trench 13 has a relatively smaller width and greater length than the shallow trench 15.

The first and second dielectric materials 80, 90 are filled in the multi-depth trench 11. In the semiconductor device 100, the first and second dielectric materials 80, 90 may each be formed from silicon oxide. In addition, the first and second dielectric materials 80, 90 may be formed having different materials from each other.

The first dielectric material 80 is filled in a predetermined area of the shallow trench 15. That is, the first dielectric material 80 is filled in side portions of the shallow trench 15. In addition, the first dielectric material 80 may be deposited shallowly on a bottom plane 13a and sidewalls 13b of the deep trench 13.

The first dielectric material 80 includes slopes 81a, 81b that are inclined with respect to the bottom plane 15a of the shallow trench 15. For example, the slopes 81a, 81b may be at an angle (α) approximately of 60° with respect to the bottom plane 15a of the shallow trench 15. However, the angle (α) may be less or greater than 60° (e.g., 30°, 45°, 70°, 80°, etc.) or, for example, between 30° and 80°. The slopes 81a, 81b of the first dielectric material 80 extend outward at the angle (α) from corners (E1, E2) where the bottom plane 15a of the shallow trench 15 and the sidewalls 13b of the deep trench 13 meet.

The second dielectric material 90 is filled in the remaining areas of the multi-depth trench 11 after the first dielectric material 80 is filled in the multi-depth trench 11. That is, the second dielectric material 90 is filled in the areas of the multi-depth trench 11 where the first dielectric material 90 is absent.

As a comparative example, if the deep trench 13 is charged first and then the shallow trench 15 is charged thereafter, or if the entire multi-depth trench 11 is charged with one single dielectric material at once, an excessive deposit of charged material can accumulated in the corners E1, E2. In this case, interspaces between the corners E1, E2 may be blocked in an arch shape prior to an interior of the deep trench 13 being completely filled, thereby resulting in a void being formed within the shallow trench 15. The void may act as a defect which affects the stability of the semiconductor device 100.

However, the excessive deposit of the second dielectric material 90 on the corners E1, E2 is avoided in the semiconductor device 100, due to the presence of the first dielectric material 80 which is filled in the multi-depth trench 11 prior to the filling of the second dielectric material 90. For example, since the first dielectric material 80 is deposited first to form the slopes 81a, 81b of the shallow trench 15, the inclining angle (β) of the corners E1, E2 becomes gentler (i.e., approximately) 150°) before the second dielectric material 90 is deposited, thereby preventing an excessive deposit of the second dielectric material 90 on the corners E1, E2. As a result, both the blockage of interspaces between the corners E1, E2 during charging of the second dielectric material 90 and the formation of a void within the shallow trench 15 are subsequently prevented.

Reference numeral 20 denotes a first hard mask layer 20 that includes a pad oxide film 30 and a pad nitride layer 40.

Figure 2:
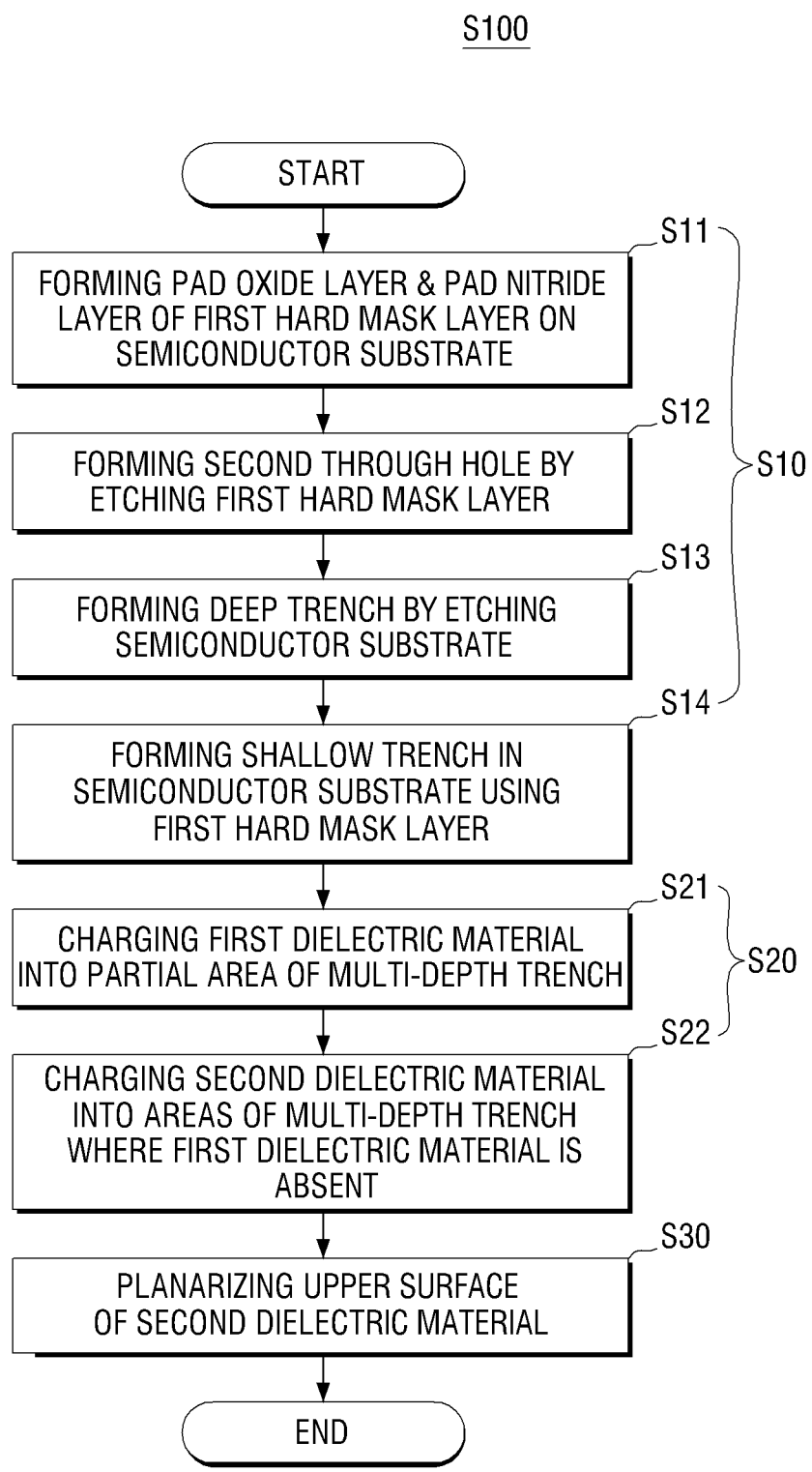
FIG. 2 is a flowchart illustrating an example of a method of fabricating a semiconductor device.

A method (S100) for fabricating the semiconductor device 100 will be explained below with reference to FIGS. 2 to 12 as well as FIG. 1. FIG. 2 is a flowchart illustrating an example of a method S100 for fabricating the semiconductor device 100, and FIGS. 3 to 12 are schematic cross-sectional views illustrating in sequence an example of a fabricating of the semiconductor device 100 according to the fabricating method S100 of FIG. 2.

At step S10, the multi-depth trench 11 is formed in the semiconductor device 10. The step S10 may include steps S11 to S14.

Figure 3:
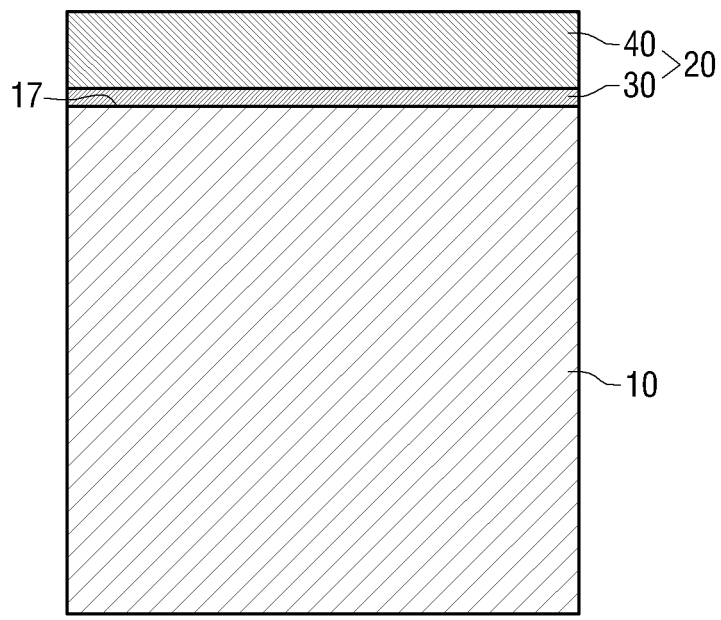
FIGS. 3 to 12 are schematic cross-sectional views illustrating in sequence an example of fabricating a semiconductor device according to the flowchart of FIG. 2.

At step S11, referring to FIG. 3, the pad oxide layer 30 and the pad nitride layer 40 are formed in sequence on an upper surface 17 of the semiconductor substrate 10. The pad nitride layer 40 may be formed by low pressure chemical vapor deposition (LP CVD) or atmospheric pressure chemical vapor deposition (APCVD), and by the reaction of silane and ammonia at 650-900° C. at atmospheric pressure (i.e., 1 atm). In addition, the pad nitride layer 40 may be formed by the reaction of dichlorosilane (DCS) and ammonia at 700-750° C. at low pressure (i.e., lower than 1 atm). The pad oxide layer 30 and the pad nitride layer 40 form the first hard mask layer 20. The first mask layer 20 is used as an etching mask during the formation of the shallow trench 15, which is carried out at a later step (i.e., step S14).

At step S12, the first hard mask layer 20 is etched to form a second through hole 21 (shown in FIG. 5) for forming the shallow trench 15 in the first hard mask layer 20.

Figure 4:
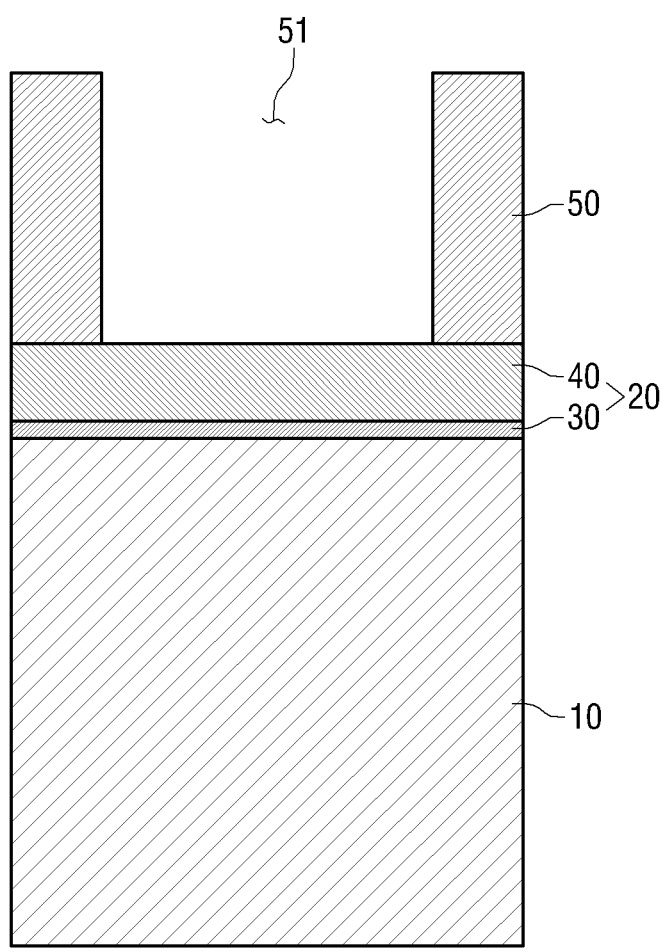

First, referring to FIG. 4, a first photosensitive film 50 is coated on the first hard mask layer 20. A first through hole 51 is then formed in the first photosensitive film 50 by a photolithographic process. The photolithographic process is a well-known technique that forms a pattern in the first photosensitive film 50 by exposing the first photosensitive film 50 to light through a mask. The exposed first photosensitive film 50 is subsequently developed, thereby forming the first through hole 51. A detailed explanation of the photolithographic process will be omitted for the sake of brevity.

Figure 5:
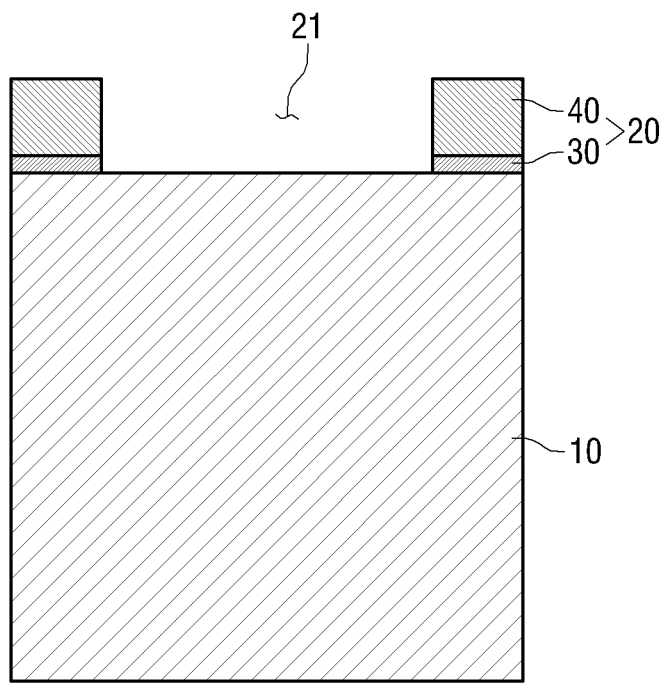

Referring to FIG. 5, the first hard mask layer 20 is etched by using the first photosensitive film 50 with the first through hole 51 formed therein as an etching mask, thereby forming a second through hole 21 corresponding to the first through hole 51. Then, the first photosensitive film 50 is removed. The second through hole 21 has the same shape and longitudinal cross-sectional area as that of the first through hole 51.

Figure 6:
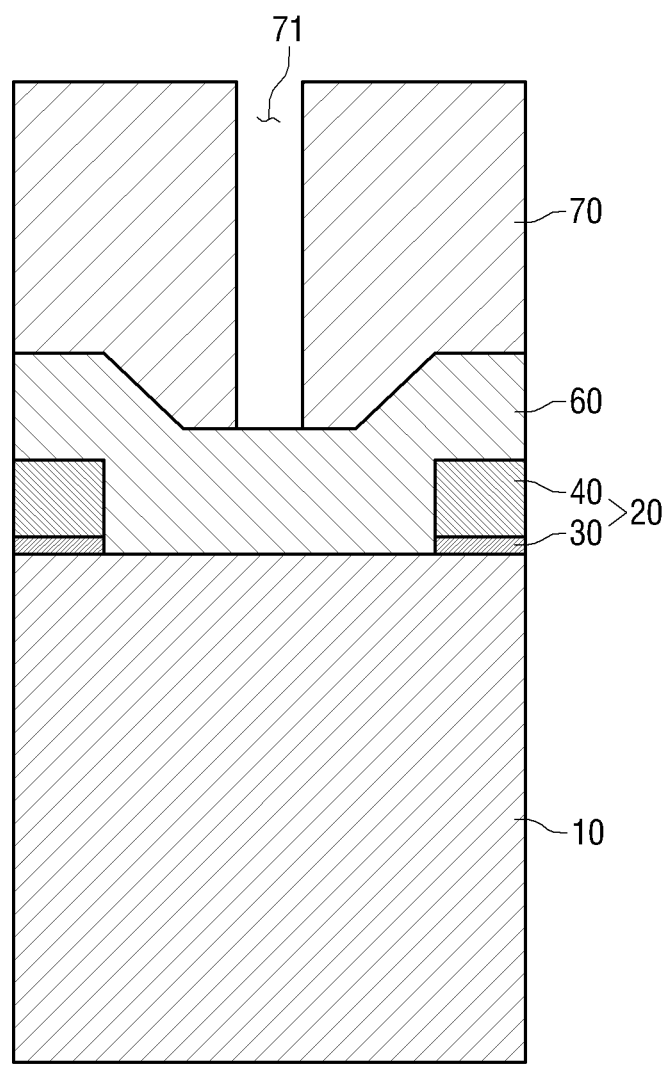

At step S13, as illustrated in FIG. 6, the semiconductor device 10 is etched to form the deep trench 13. First, a second hard mask layer 60 is filled in the area of the second through hole 21 and deposited on the first hard mask layer 20 at a thickness in a range of approximately 0.1 µm to approximately 3.0 µm. Then, a second photosensitive film 70 is coated on the second hard mask layer 60, and a third through hole 71 is formed using a photolithographic process. The second hard mask layer 60 is used to prevent subsequent etching of the first hard mask layer 20. For example, the second hard mask layer 60 is deposited by LPCVD, APCVD, or plasma enhanced chemical vapor deposition (PECVD) using silicon oxide, silicon oxynitride, silicon nitride, silicon-rich oxide materials, or a combination thereof.

Figure 7:
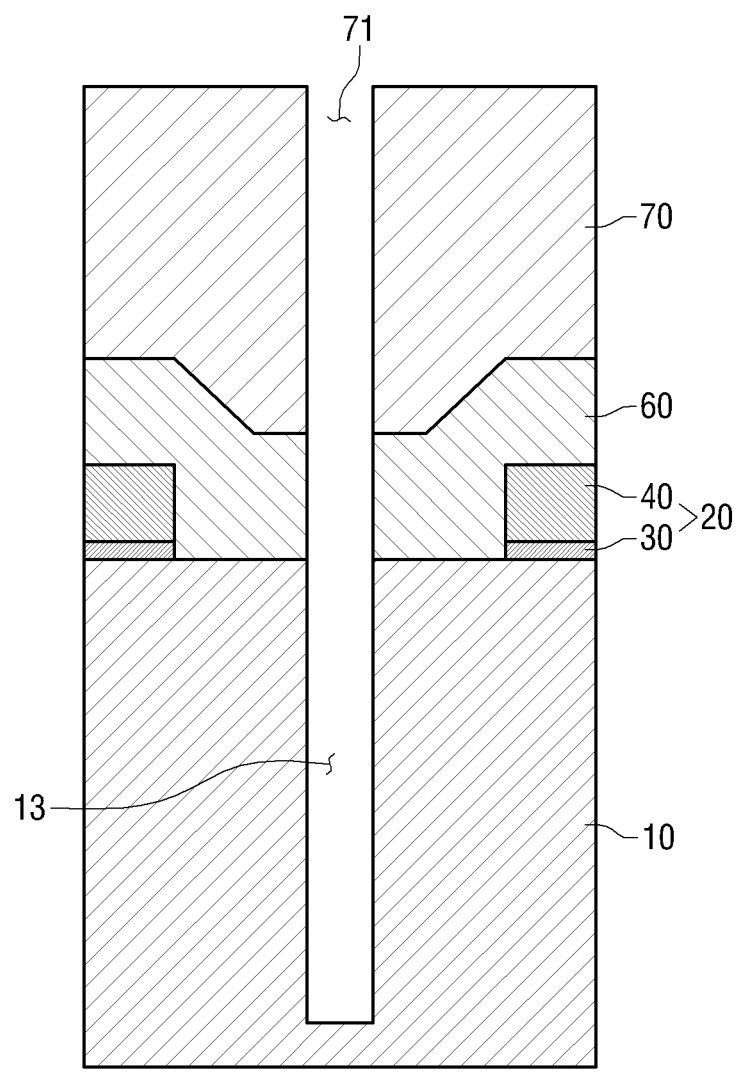

After that, referring to FIG. 7, the deep trench 13 is formed by etching the semiconductor substrate 10 as well as the second hard mask layer 60 according to the third through hole 71.

Figure 8:
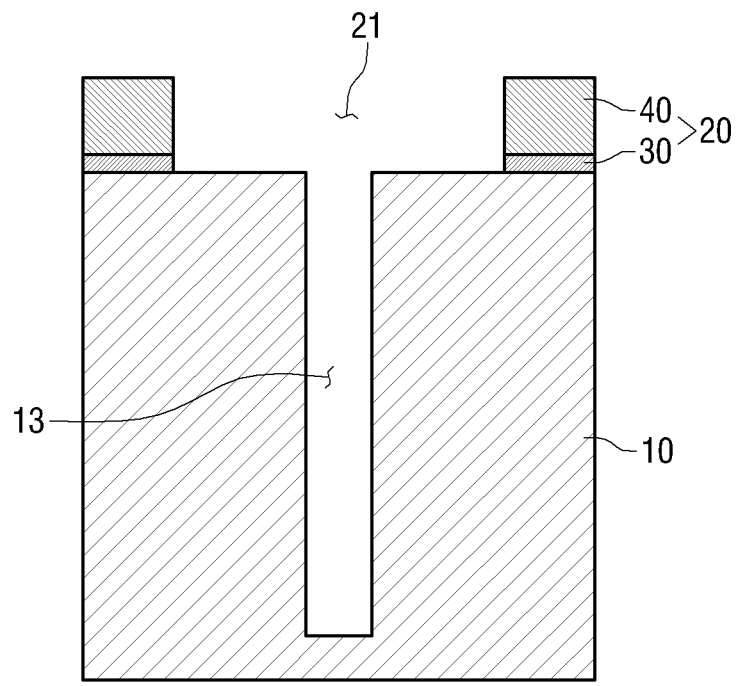

Referring to FIG. 8, the second photosensitive film 70 and the second hard mask layer 60 are removed in sequence. The second hard mask layer 60 herein may be removed by wet etching. Examples of the wet etchant may include, but are not limited to, fluoric acid (HF) solution including HF diluted in water ($H_2O$).

Figure 9:
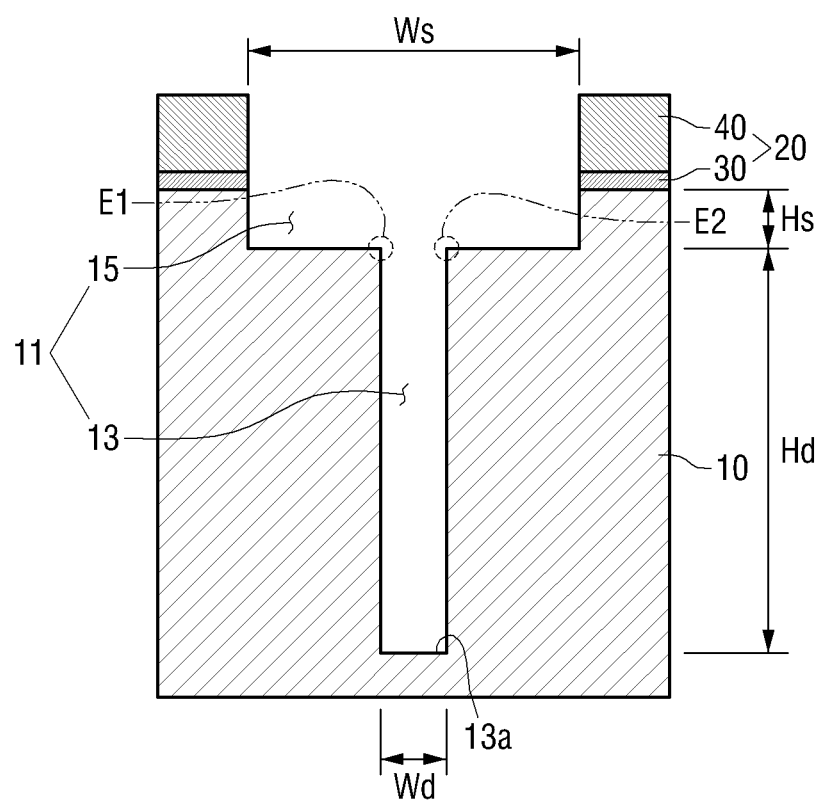

At step S14, referring to FIG. 9, the shallow trench 15 is formed according to the second through hole 21 (see FIG. 8) by etching the semiconductor substrate 10 using the first hard mask layer 20 as an etching mask. As a result, the multi-depth trench 11 including the shallow trench 15 and the deep trench 13 is completed. The deep trench 13 has a width Wd in a range of approximately 1 µm to approximately 3 µm, and a depth Hd in a range of approximately 10 µm to approximately 30 µm. The shallow trench 15 has a width Ws in a range of approximately 0.4 µm to approximately 25 µm, or, for example, a range of approximately 5 µm to approximately 7 µm. The shallow trench 15 has a depth Hs in a range of approximately 0.1 µm to approximately 1.0 µm.

As a comparative example, a photosensitive film may be used instead of the hard mask layer as the etching layer to form the shallow trench 15. However, the photosensitive film is coated within the deep trench 13 while being coated on the semiconductor substrate 10. It is preferable that the photosensitive film coated within the deep trench 13 be removed completely before the shallow trench 15 is formed, but a portion of the photosensitive film, particularly in a vicinity of the bottom plane 13a of the deep trench 13, may not be exposed to light and remain there as a result. As a result, a notch may be generated in the vicinity of the bottom plane 13a of the deep trench 13 during the process of forming the shallow trench 15. The notch may act as a defect.

However, in the semiconductor device 100, the formation of the notch near the bottom plane 13a of the deep trench 13 can be avoided since the first hard mask layer 20 is used, instead of a photosensitive film, as the etching mask during the forming of the shallow trench 15.

Meanwhile, the deep trench 13 is formed first at step S13, and the shallow trench 15 is formed at step S14. At step S14, when the shallow trench is formed, a portion of the upper area of the deep trench 13 is encroached by the shallow trench 15. Accordingly, an undesirable undercut or rough surface, which would otherwise exist on the upper area of the deep trench 15, can be removed.

At step S20, dielectric material is charged into the multi-depth trench 11. Step S20 includes steps S21 and S22.

At step S21, although not illustrated, a trench-liner oxide or a trench-liner nitride may be deposited. The trench-liner oxide or trench-liner nitride may be deposited by LPCVD to have a thickness in a range of 500 Å to 5000 Å. The trench-liner oxide or trench-liner nitride may be deposited to protect a silicon sidewall of the trench or release the stress between the charged material (high density plasma (HDP) CVD oxide) and the silicon during the following HDP CVD oxide deposition.

Figure 10:
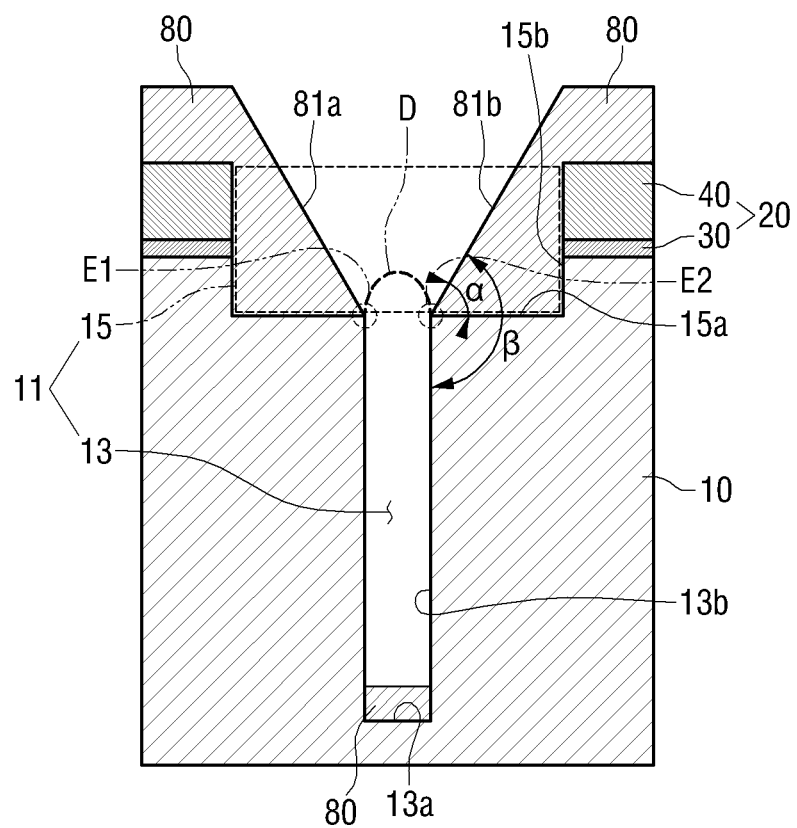

At step S21, referring to FIG. 10, a first dielectric material 80 is filled in some areas of the shallow trench 15 and the deep trench 13 of the multi-depth trench 11. The first dielectric material 80 includes silicon oxide. The first dielectric material 80 may be deposited by CVD, or, for example, by non-conformal HDP CVD. The first dielectric material 80 may be deposited to a thickness in a range of 3000 Å to 25000 Å, or, for example, 8000 Å to 13000 Å.

Figure 11:
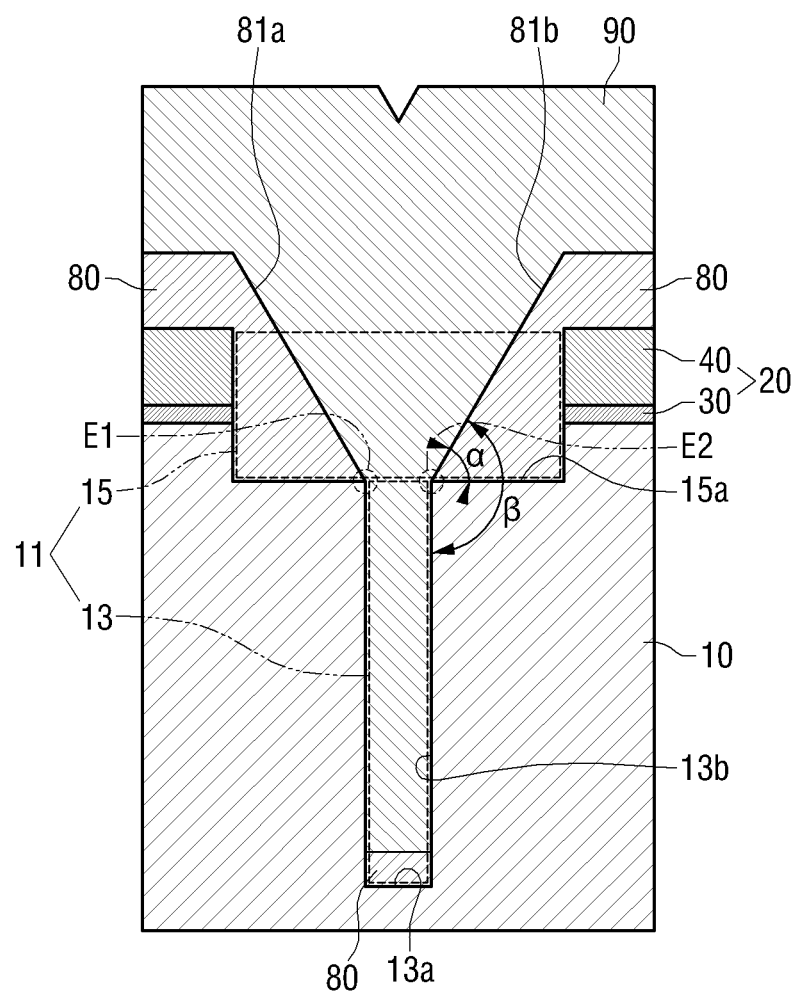

The first dielectric material 80 may be filled to cover both side portions of the shallow trench 15, but not to cover the center portion of the shallow trench 15, and to have the slopes 81a, 81b extending upward from the corners E1, E2. In addition, as is illustrated in FIG. 11, the first dielectric material 80 may be deposited shallowly on the bottom plane 13a and the sidewalls 13b of the deep trench 13. However, in this case, the sidewalls 13b are deposited with a width of the first dielectric material 80 that is far less than a width of the first dielectric material 80 deposited on the bottom plane 13a. By way of example, the first dielectric material may be deposited on the bottom plane 13a at a thickness of 1.3 μm, in which case the first dielectric material 80 deposited on the sidewalls 13b may be less than 100 nm (0.1 μm). That is, the thickness of deposition of the first dielectric material 80 on the sidewalls 13b corresponds approximately to one-tenth of the thickness of deposition of the first dielectric material 80 on the bottom plane 13a. As such, it is recognizable that the deposition of the first dielectric material 80 on the sidewalls 13b is relatively minute. This is due to a considerably deeper depth of the deep trench 13 and characteristics of the HDP deposition that involve repetitive deposition and etching. However, in LP CVD, both the sidewalls 13b and the bottom plane 13a are deposited with similar speed. Accordingly, the silicon oxide is grown on both sidewalls 13b to meet at the center region of the deep trench 13.

The first dielectric material 80 may be deposited by CVD, or, for example, by HDP CVD. HDP CVD has the characteristic of repetitive deposition and etching (or sputtering). Based on such a characteristic, the first dielectric material 80 charged into the multi-depth trench 11 has the slopes 81a, 81b inclining with respect to the bottom plane 15a of the shallow trench 15. In HDP CVD, the deposition can be carried out by using deposition gas, such as monosilane ($SiH_4$) in plasma state, $O_2$, or $H_2$ gas, and etching can be carried out by Ar sputtering using plasma of Ar gas. The ratio of deposition and etching (or sputtering) may be, for example, in a range from 5:1 to 15:1. At such a ratio, the multi-depth trench 11 having the shallow trench 15 and the deep trench 13 can be charged efficiently.

In the semiconductor device 100, the angle (α) of the slopes 81a, 81b is approximately 60°, but in other examples, the angle (α) may be greater or less, and, for example, between 30° and 80°.

As explained above, since the first dielectric material 80 has the slopes 81a, 81b, the corners E1, E2, at which the sidewalls 13b of the deep trench 13 and the bottom plane 15a of the shallow trench 15 meet, have a gentler angle. That is, the angle (β) of the corners E1, E2, which is approximately 90° initially, is changed to be approximately 150° after the first dielectric material 80 is deposited.

At step S22, referring to FIG. 11, the second dielectric material 90 is charged into the remaining areas of the multi-depth trench 11 where the first dielectric material 80 is absent. Accordingly, the second dielectric material 90 is filled in the remaining areas of the shallow trench 15 and the deep trench 13 where there is no first dielectric material 80 charged.

Like the first dielectric material 80, the second dielectric material 90 may be silicon oxide. However, the second dielectric material 90 may be formed from polysilicon, which is a different material from that of the silicon oxide of the first dielectric material 80. The second dielectric material 90 may be deposited by CVD, or, for example, by LP CVD or APCVD.

In LP CVD, a silicon oxide layer is fabricated using a gas which includes a mixture of TEOS($Si(C_2H_5O)_4$, Tetraethoxy Silane) and oxygen. Since TEOS is in a liquid state at atmospheric temperature, TEOS is gasified using carrier gas and then undergoes pyrolysis or decomposition in order to be used for the fabrication of the silicon oxide layer. Other than TEOS, $SiH_4$ or $SiH_2$ may be used as the silicon source. $N_2O$ or ozone gas may be used as the oxide gas instead of $O_2$. The temperature of processing may vary depending on the gas being used, but generally, it may be in a range between 500° C. and 800° C. The pressure may be lower than 1 atm, which may generally be in a range between 300 Torr and 600 Torr.

The breakdown voltage greatly increases when charging a silicon oxide layer (i.e., $SiO_2$) instead of polysilicon. For example, a shallow silicon oxide layer forms a sidewall oxide before polysilicon is charged into the deep trench area, and polysilicon is charged into the remaining empty spaces. In this case, the polysilicon layer floats from the silicon substrate at a distance of the silicon oxide layer. The breakdown voltage is lower in this case, since the thickness of such a shallow oxide layer is far less than the thickness obtained by charging with the pure oxide layer (i.e., silicon oxide layer). This is because the breakdown voltage is proportional to the thickness of a silicon oxide layer.

In semiconductor device 100, the silicon oxide layer is used as the filler material of the multi-depth trench 11 so that the breakdown characteristics are improved compared to when polysilicon is used as the filler material.

Since the angle (β) of the corners E1, E2 is smoothed to approximately 150° due to the first dielectric material 80 at step S21, at step S22, excessive deposition of the second dielectric material 90 on the corners E1, E2 is prevented.

If the second dielectric material 90 is charged in a state that the angle (β) of the corners E1, E2 is approximately 90°, the second dielectric material 90 is deposited excessively on the corners E1, E2, so that a blocking film in an arch shape may be formed along a dotted line (D) of FIG. 10 between the corners E1, E2. Due to the presence of the blocking film, a void may be generated under the blocking film at the center portion of the shallow trench 15. The void, when generated in the shallow trench 15, can cause the upper surface of the semiconductor device to be exposed to the outside during a polishing or an etching of the upper surface of the semiconductor device, which, in turn, can cause a very serious defect.

The semiconductor device 100 prevents formation of a void within the shallow trench 15 and subsequent blockage of the interspaces between the corners E1, E2, because the first dielectric material 80 is charged such that the shallow trench 15 has the slopes 81a, 81b before the second dielectric material 90 is charged.

Figure 12:
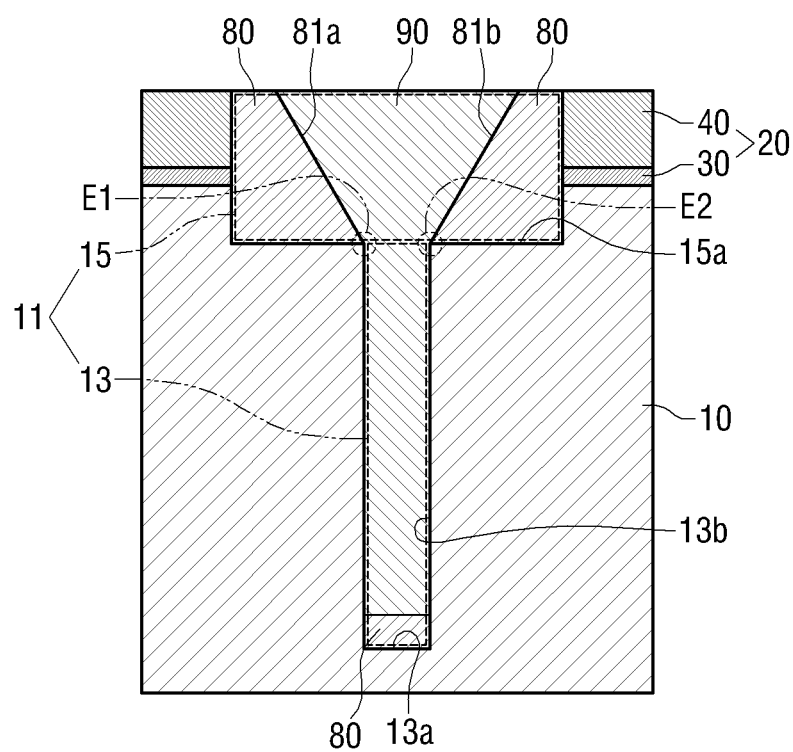

Finally, at step S30, referring to FIG. 12, the upper surface of the second dielectric material 90 is planarized by chemical mechanical planarization (CMP), and the method (step S10) for fabricating the semiconductor device is completed.

Figure 13:
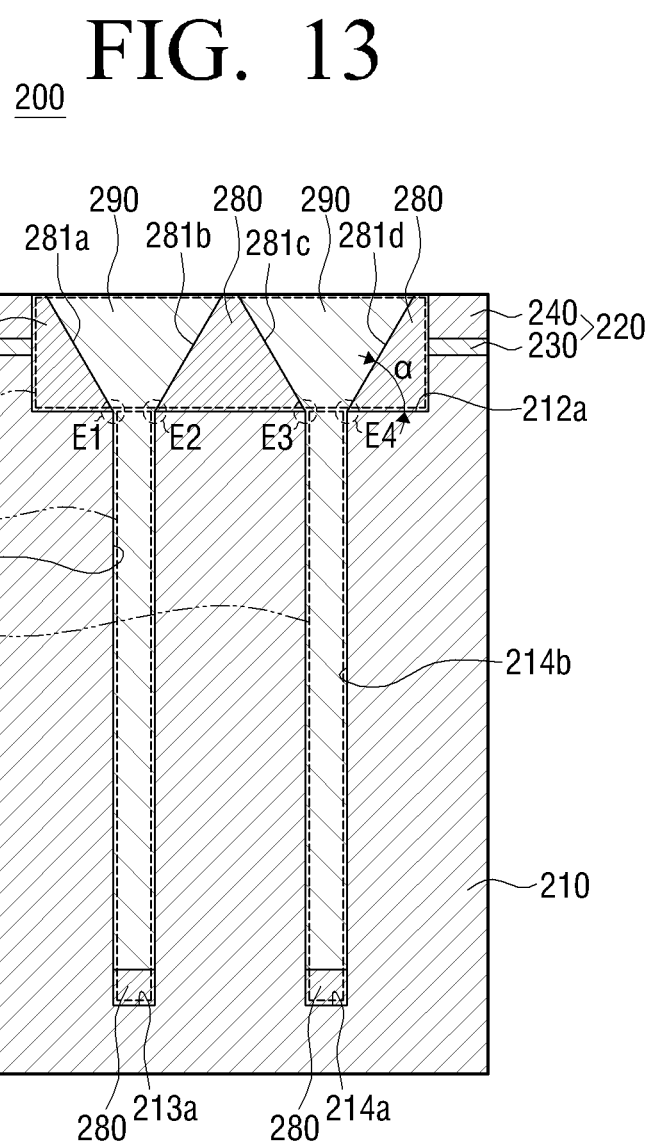
FIG. 13 is a schematic cross-sectional view illustrating another example of a semiconductor device.

A semiconductor device 200 will now be explained below with reference to FIGS. 13 to 21. FIG. 13 is a schematic cross-sectional view illustrating an example of the semiconductor device 200. FIG. 13 illustrates an inactive region (or device isolating region) of a semiconductor device formed between active regions of the semiconductor device. Referring to FIG. 13, the semiconductor device 200 includes, but is not limited to, a semiconductor substrate 210 in which a multi-depth trench 211 is formed, and first and second dielectric materials 280, 290 that are filled in the multi-depth trench 211. The multi-depth trench 211 may include one shallow trench 212 arranged on an upper portion of the semiconductor substrate 210, and two deep trenches 213, 214 arranged on a lower portion of the semiconductor substrate 210. The deep trenches 213, 214 may have the same width and thickness, and may be arranged at a predetermined interval from each other.

The multi-depth trench 211 is filled with first and second dielectric materials 280, 290. For example, the first dielectric material 280 may be charged into side and center portions of the shallow trench 212. In addition, the first dielectric material 280 may be deposited shallowly on respective bottom planes 213a, 214a and respective sidewalls 213b, 214b of the deep trenches 213, 214. The second dielectric material 290 may be charged into the remaining areas of the multi-depth trench 211 in which the first dielectric material 280 is absent.

The first dielectric material 280 has slopes 281a, 281b, 281c, 281d inclined with respect to the bottom plane 212a of the shallow trench 212. For example, the angle (α) of the slopes 281a, 281b, 281c, 281d with respect to the bottom plane 212a of the shallow trench 212 is approximately 60°. However, the angle (α) may be less or greater than 60° (e.g., 30°, 45°, 70°, 80° etc.), or, for example, between 30° and 80°. The slopes 281a, 281b, 281c, 281d of the first dielectric material 280 may extend outward at the angle (α) from corners E1, E2, E3, E4 where the sidewalls 213b, 214b of the deep trenches 213, 214 meet the bottom plane 212a of the shallow trench 212.

The slopes 281a, 281b, 281c, 281d of the first dielectric material 280 are formed through repetitive deposition and etching processes. Accordingly, excessive deposition of the second dielectric material 290 on the corners E1, E2, E3, E4 can be prevented. As a result, generation of a void within the shallow trench 212, due to the presence of arch-shaped blocking films in the interspaces between the corners E1 and E2 and between the corners E3 and E4 during the charging of the second dielectric material 290 into the multi-depth trench 211, can be prevented. The semiconductor device 200 includes two deep trenches 213, 214 and thus provides increased breakdown voltage.

Reference numeral 220 denotes a first hard mask layer which includes a pad oxide layer 230 and a pad nitride layer 240.

An example of a method of fabricating the semiconductor device 200 will be explained below with reference to FIGS. 14 to 21. The overlapping of the method of fabricating the semiconductor device 100 explained above will not be repetitively explained for the sake of brevity, while different aspects will be particularly explained below. FIGS. 14 to 21 are cross-sectional views illustrating an example of a method of fabricating the semiconductor device 200 in sequence.

Figure 14:
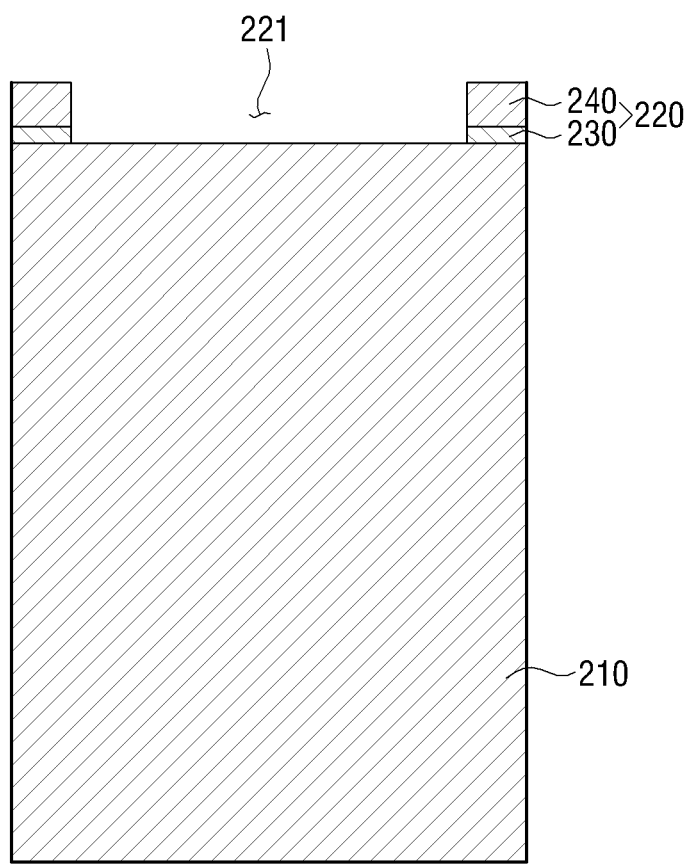
FIGS. 14 to 21 are cross-sectional views illustrating in sequence another example of a method of fabricating a semiconductor device.

Referring to FIG. 14, first, the pad oxide layer 230 and the pad nitride layer 240 to form the first hard mask layer 220 are formed in sequence on the semiconductor substrate 210. A second through hole 221 corresponding to a first through hole (not illustrated) is then formed in the first hard mask layer 220 using a first photosensitive layer (not illustrated) in which the first through hole is formed. For example, the second through hole 221 has the same shape and longitudinal cross-sectional area as that of the first through hole.

Figure 15:
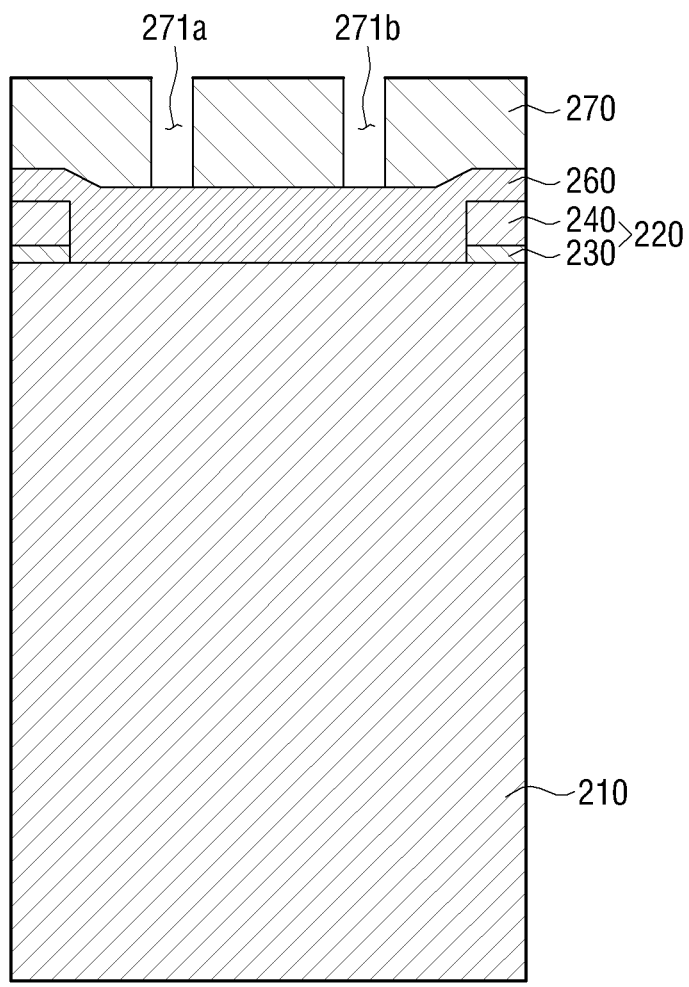

Referring to FIG. 15, next, a second hard mask layer 260 is deposited on the first hard mask layer 220, and a second photosensitive layer 270 is coated on the second hard mask layer 260. Then, using the photolithographic process, two third through holes 271a, 271b with the same width are formed in the second photosensitive layer 270.

Figure 16:
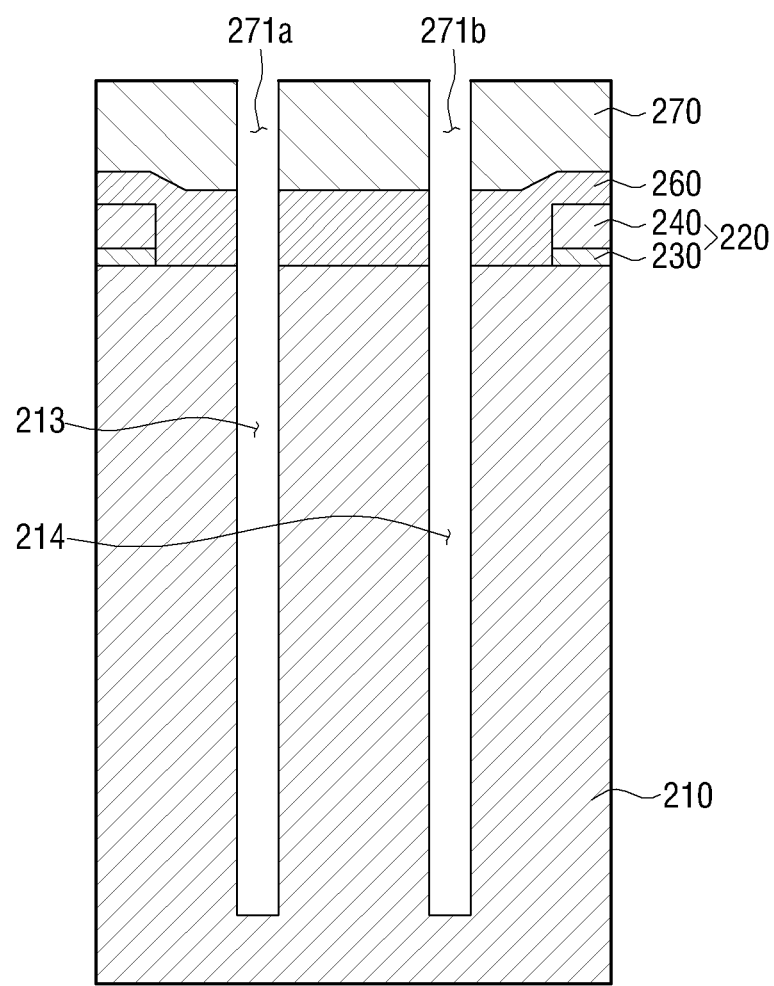

Referring to FIG. 16, next, two deep trenches 213, 214 corresponding to the two third through holes 271a, 271b are formed by etching the semiconductor substrate 210 as well as the second hard mask layer 260 through the third through holes 271a, 271b of the second photosensitive layer 270.

Figure 17:
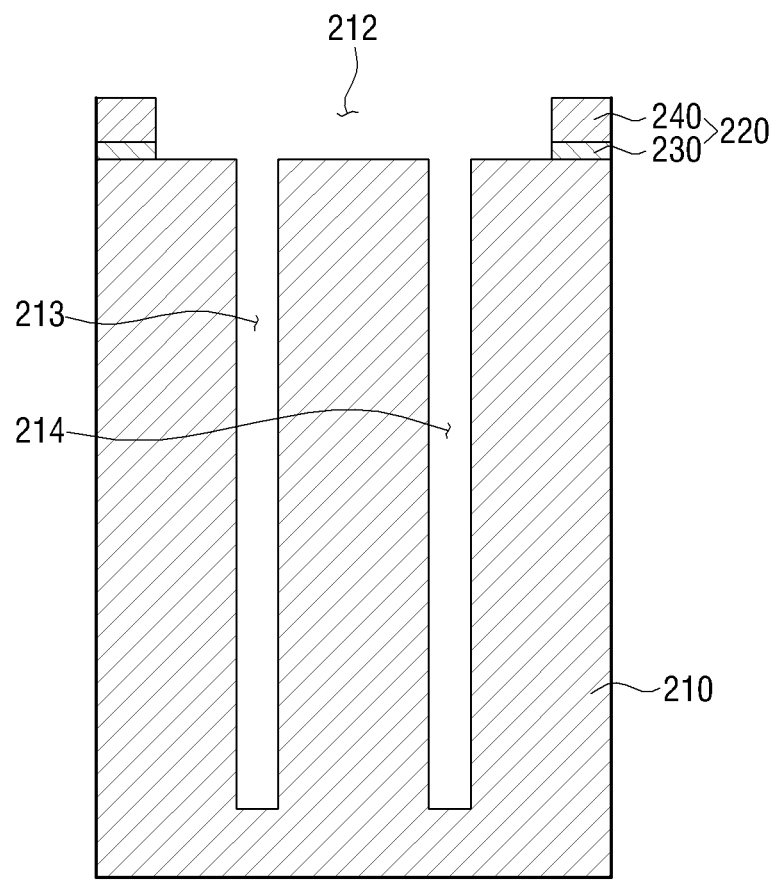

Referring to FIG. 17, next, the second photosensitive layer 270 and the second hard mask layer 260 are removed in sequence. The second hard mask layer 260 may be removed by wet etching using etchant. Examples of etchant may include, but are not limited to, fluoric acid (HF) solution including HF diluted in water ($H_2O$).

Figure 18:
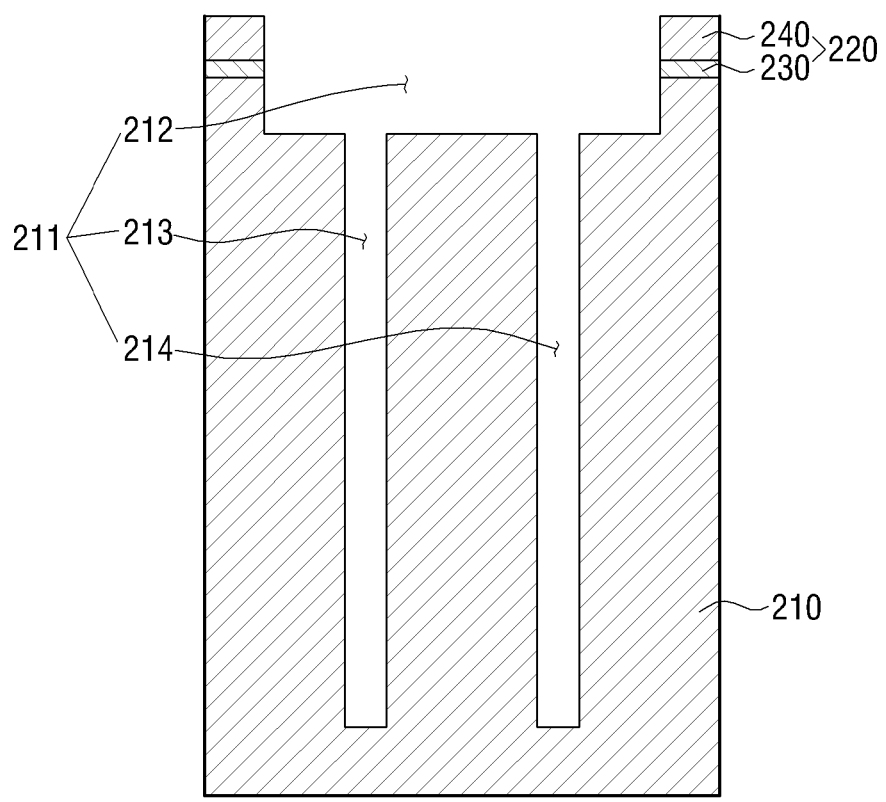

Referring to FIG. 18, next, a shallow trench 212 corresponding to the second passing hole 221 (see FIG. 17) is formed by etching the semiconductor substrate 210 using the hard mask layer 220 and the etching mask. As a result, a multi-depth trench 211 including one shallow trench 212 and two deep trenches 213, 214 is completely formed.

For example, a photosensitive layer may be used instead of the hard mask layer 220 to form the shallow trench 212. In such an example, a notch may be generated in the vicinity of the bottom planes 213a, 214a of the deep trenches 213, 214 during the formation of the shallow trench 212 due to some of the photosensitive layer remaining in the bottom planes 213a, 214a of the deep trenches 213, 214. However, the fabrication of semiconductor device 200 prevents generation of such a notch in the vicinity of the bottom planes 213a, 214a of the deep trenches 213, 214 by using the first hard mask layer 220 as the etching mask instead of the photosensitive layer during formation of the shallow trench 212.

Meanwhile, in the semiconductor device 200, since the shallow trench 212 is formed after the deep trenches 213, 214 are formed, the upper areas of the deep trenches 213, 214 are partially encroached by the shallow trench 212. Accordingly, undercut and/or rough surfaces that otherwise may exist on the upper areas of the deep trenches 213, 214 are eliminated.

Figure 19:
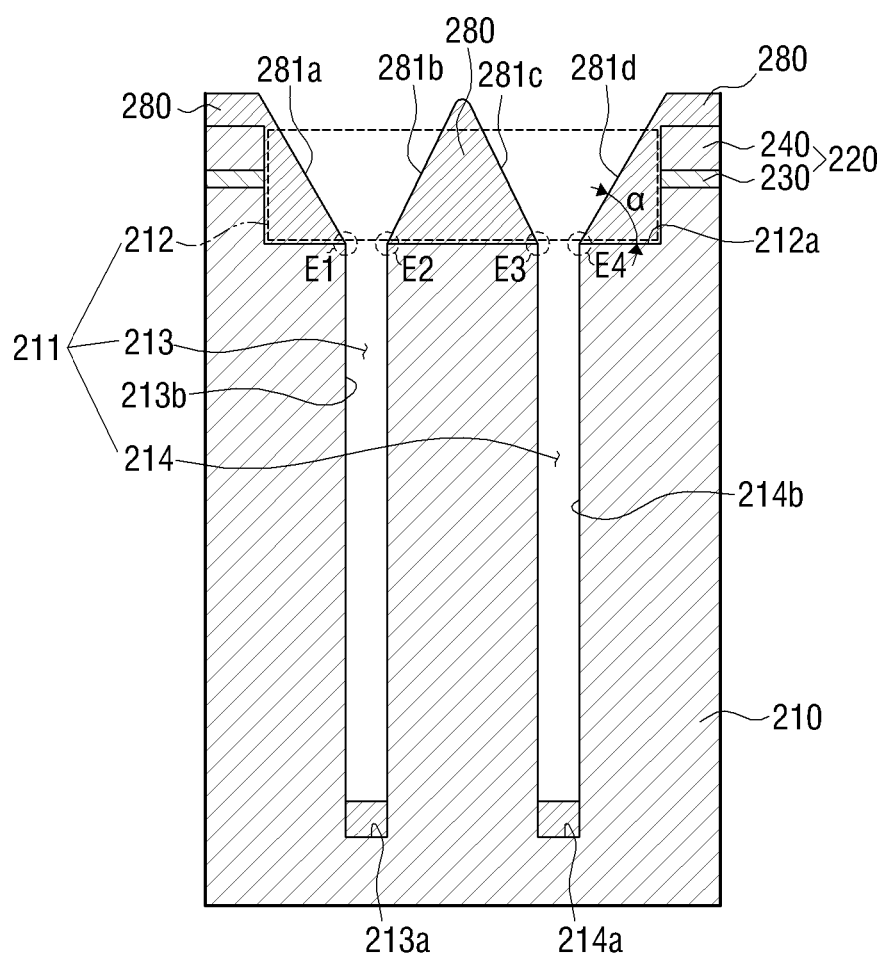

Referring to FIG. 19, next, the first dielectric material 280 including silicon oxide is charged into the shallow trench 212 of the multi-depth trench 211. The first dielectric material 280 may be deposited by CVD, or, for example, by non-conformal HDP CVD. The first dielectric material 280 may be partially charged into the shallow trench 212. The first dielectric material 280 may also be deposited on the bottom planes 213a, 214a of the deep trenches 213, 214 in a thickness similar to a thickness of the first dielectric material 280 deposited on the first hard mask layer 220. The first dielectric material 280 may be deposited on the sidewalls 213b, 214b of the deep trenches 213, 214 in a smaller amount compared to the amount of the first dielectric material 280 deposited on the bottom planes 213a, 214a.

The reason for depositing the first dielectric material 280 on the sidewalls 213b, 214b in a smaller amount is due to the bottom-up fill processing of the HDP deposition. According to HDP deposition, since RF bias is applied to the wafer, both deposition and sputtering occur at the same time. Additionally, since gases have linearity due to plasma deposition, less time is given for the deposition on the sidewalls than on the bottom planes, so that the oxide layer is not generally formed properly on the sidewalls. The above-mentioned sputtering may be carried out by adding argon, helium, or hydrogen as the process demands, or by oxygen used for deposition. Further, $NF_3$ gas may be used.

The HDP CVD has the characteristics of repeating deposition and etching, and based on such characteristics, the first dielectric material 280 charged into the multi-depth trench 211 has the slopes 281a, 281b, 281c, 281d inclined with respect to the bottom plane 212a of the shallow trench 212. The angle ($\alpha$) of the slopes 281a, 281b, 281c, 281d is illustrated to be approximately 60° in FIG. 19, but the angle ($\alpha$) may be less or greater than 60°, or, for example, between 30° and 80°.

Figure 20:
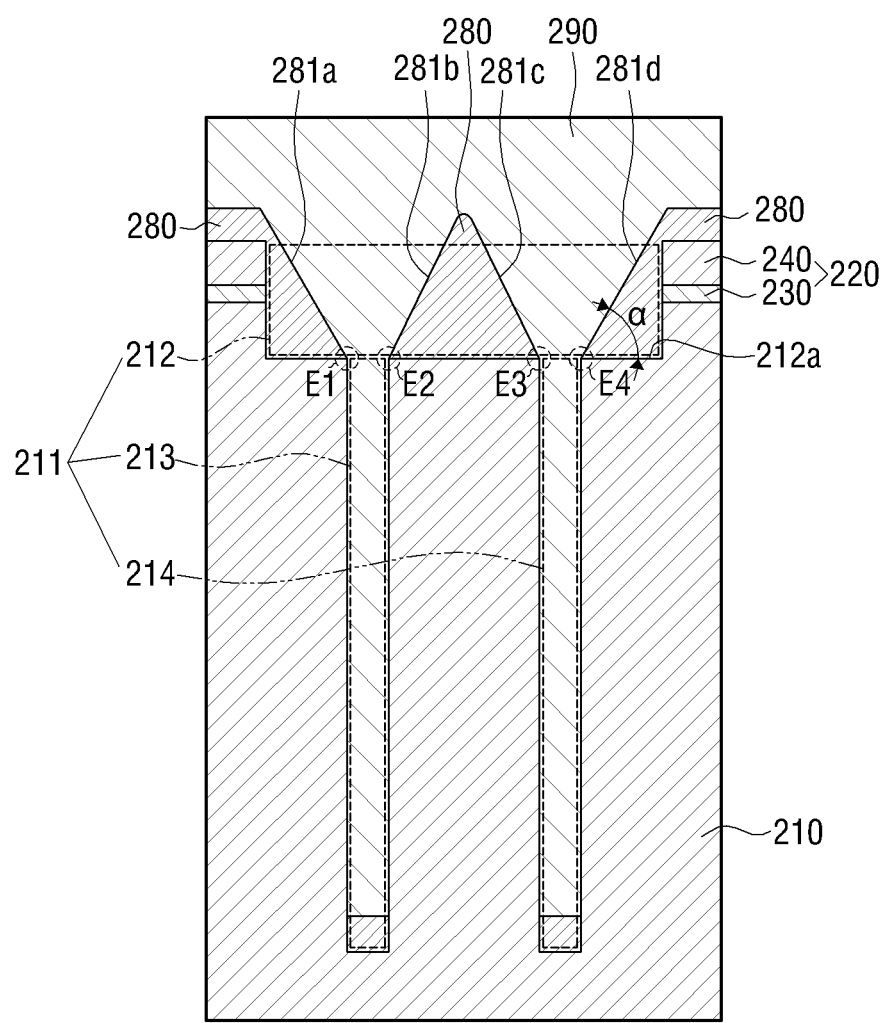

Referring to FIG. 20, next, the second dielectric material 290 is charged into the remaining areas of the multi-depth trench 211, i.e., the areas where there is no first dielectric material 280 charged. The first dielectric material 280 is not charged in an entirety of the multi-depth trench 211, because the first dielectric material 280 is deposited by the HDP process. That is, since the thickness of deposition of the first dielectric material 280 on the sidewalls 213b, 214b (see FIG. 19) is comparably minute to the thickness of the deposition of the first dielectric material on the bottom planes 213a, 213b, it is lengthy and inefficient to charge the entirety of the multi-depth trench 211 with the first dielectric material 280. Considering this, the remaining areas of the multi-depth trench 211, which are not filled by the first dielectric material 280, are filled by LPCVD. In LPCVD, since dielectric material is deposited conformally, the multi-depth trench 211 is charged such that deposition is carried out at the same ratio on the sidewalls and bottom planes. The second dielectric material 290 may use silicon oxide layer like the first dielectric material 280. However, the second dielectric material 290 may use polysilicon, which is different from the first dielectric material 280. The second dielectric material 290 is deposited by CVD or, for example, by LP CVD (LP CVD).

Since the first dielectric material 280 having the slopes 281a, 281b, 281c, 281d is formed in advance, excessive deposition of the second dielectric material 290 on the corners E1, E2, E3, E4 of the multi-depth trench 211 can be avoided. Accordingly, generation of a void within the shallow trench 212 due to excessive deposition of the second dielectric material 290 on the corners E1, E2, E3, E4 can be prevented.

Figure 21:
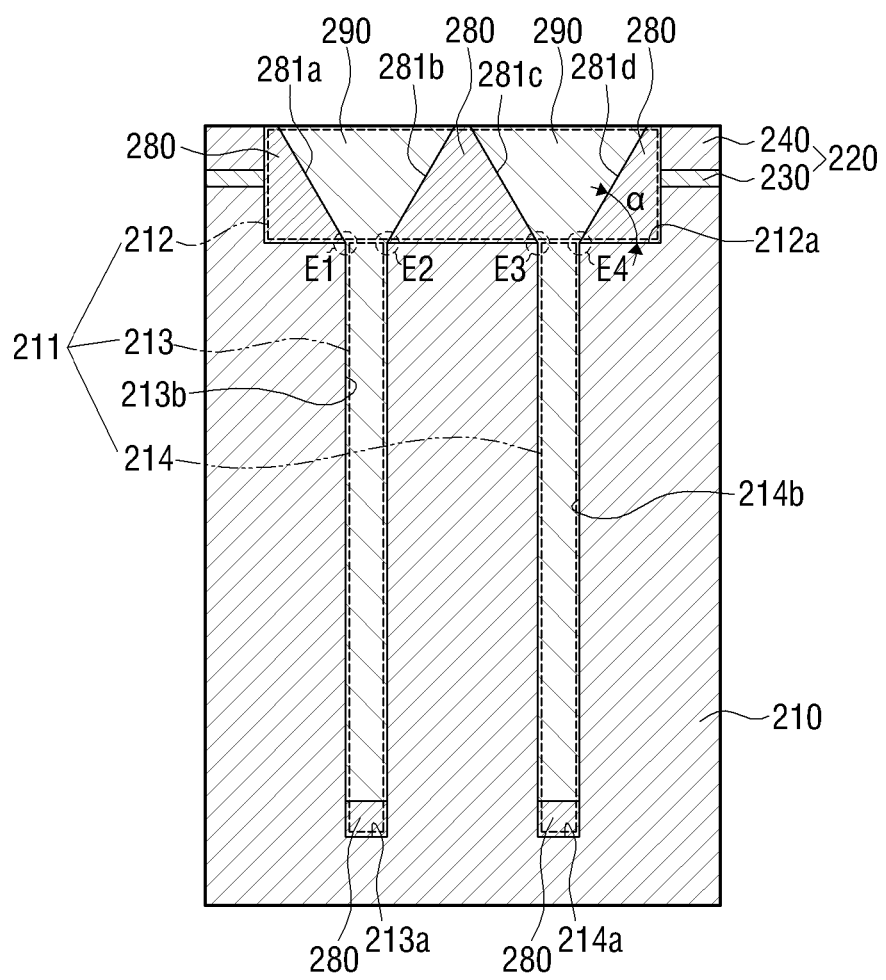

Referring to FIG. 21, lastly, the upper surface of the second dielectric material 290 is planarized by CMP.

Figure 22:
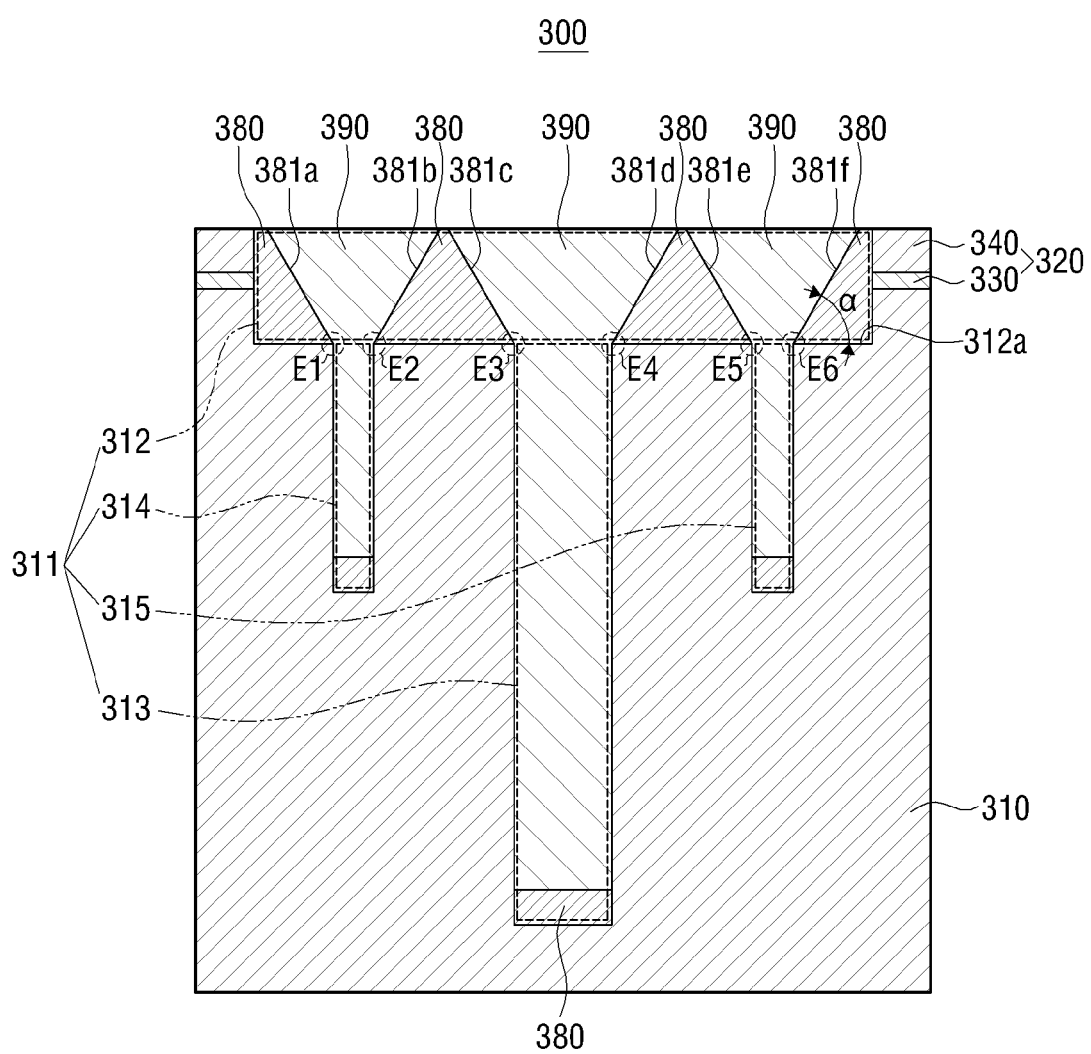
FIG. 22 is a schematic cross-sectional view illustrating yet another example of a semiconductor device.

A semiconductor device 300 will now be explained with reference to FIG. 22. FIG. 22 is a schematic cross-sectional view illustrating an example of the semiconductor device 300. For example, FIG. 22 illustrates an inactive region (or element isolating region) of the semiconductor device 300 formed between active regions. Referring to FIG. 22, the semiconductor device 300 includes a semiconductor substrate 310 in which a multi-depth trench 311 is formed, and first and second dielectric materials 380, 390 charged into the multi-depth trench 311.

The multi-depth trench 311 includes one shallow trench 312 arranged in an upper portion, and three deep trenches 313, 314, 315 arranged in a lower portion. The deep trenches 313, 314, 315 are arranged at intervals. The deep trench 313 is formed in the middle of the semiconductor substrate 310, and is formed deeper and thicker than the other two deep trenches 314, 315, which are respectively formed on opposite sides of the deep trench 313.

The semiconductor device 300 may be fabricated by a method similar to that of the semiconductor device 200. While one second photosensitive layer 270 is used to form the two deep trenches 213, 214 for the fabrication of the semiconductor device 200, one second photosensitive layer (not illustrated) is used with respect to the deep trench 313 and another second photosensitive layer (not illustrated) is used with respect to the other two deep trenches 314, 315. By way of example, the deep trenches 314, 315 may be formed first by using one second photosensitive layer. Then, the deep trench 313 may be formed by using the other second photosensitive layer. The deep trenches 314, 315 are filled by the photosensitive layer to prevent further etching thereof by the process of forming the deep trench 313.

Similar to the semiconductor devices 100, 200 explained above, the first dielectric material 380 of the semiconductor device 300 has slopes 381a, 381b, 381c, 381d, 381e, 381f inclined with respect to the bottom plane 312a of the shallow trench 312 at an angle ($\alpha$). For example, the angle ($\alpha$) may be less or greater than 60° (e.g., 30°, 45°, 70°, 80° etc.), or, for example, between 30° and 80°.

Since the first dielectric material 380 is formed in advance of the second dielectric material 390 at the angle ($\alpha$) with respect to the bottom plane 312a of the shallow trench 312, excessive deposition of the second dielectric material 390 on the corners E1, E2, E3, E4, E5, E6 near the boundaries between the deep trenches 313, 314, 315 can be prevented. As a result, generation of a void within the shallow trench 312 due to formation of arch-shaped blocking films in the interspaces between the corners (i.e., interspace between E1 and E2, E3 and E4, and E5 and E6) during charging of the second dielectric material 390 can be prevented.

The semiconductor device 300 includes three deep trenches 313, 314, 315 and thus provides increased breakdown voltage.

Reference numeral 320 denotes a first hard mask layer which includes a pad oxide layer 330 and a pad nitride layer 340.

Figure 23:
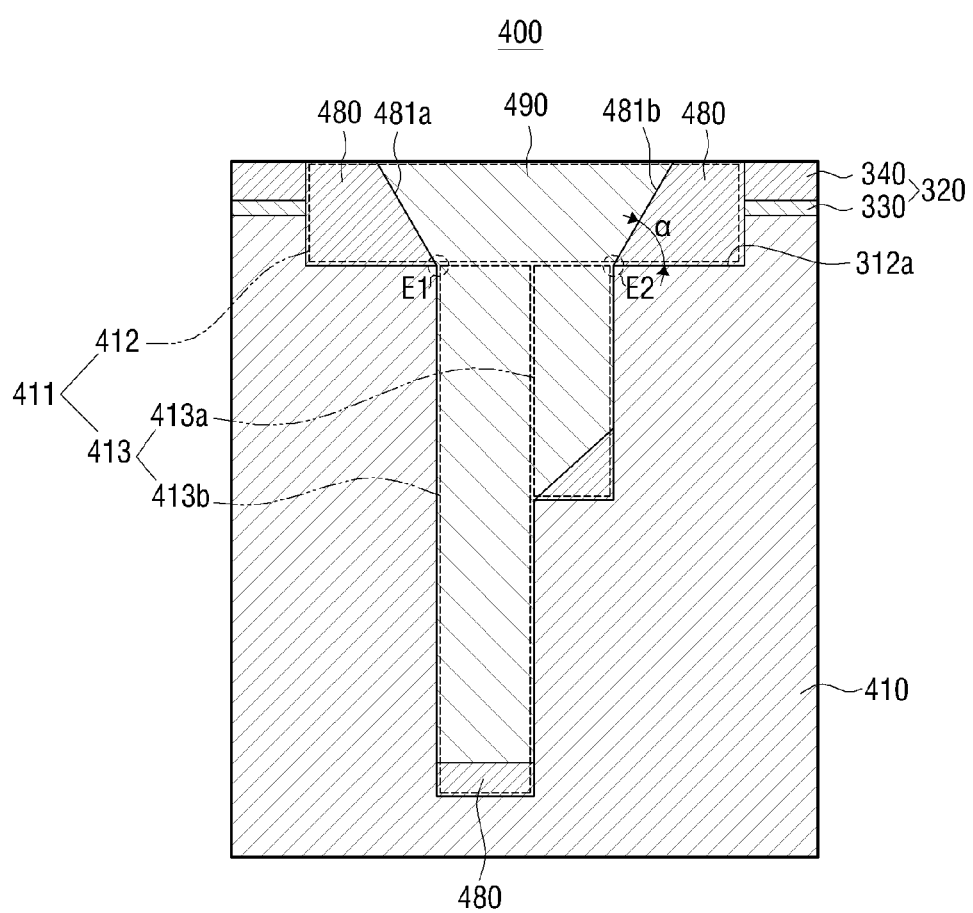
FIG. 23 is a schematic cross-sectional view illustrating still another example of a semiconductor device.

A semiconductor device 400 will now be explained below with reference to FIG. 23. FIG. 23 is a schematic cross-sectional view illustrating an example of the semiconductor device 400. For example, FIG. 23 illustrates an inactive region (or element isolating region) of the semiconductor device 400 formed between active regions. Referring to FIG. 23, the semiconductor device 400 includes, but is not limited to, a semiconductor substrate 410 in which a multi-depth trench 411 is formed, and first and second dielectric materials 480, 490 that are charged into the multi-depth trench 411.

The multi-depth trench 411 may include one shallow trench 412 arranged in an upper portion, and a deep trench 413 arranged in a lower portion. The deep trench 413 may include a first deep trench portion 413a and a second deep trench portion 413b, the second deep trench portion 413b having a depth that is greater than a depth of the first deep trench portion 413a. That is, the multi-depth trench 411 includes the first and second deep trench portions 413a, 413b having a step formed on the boundary therebetween.

The semiconductor device 400 may be fabricated similarly to that of the semiconductor device 100. While the semiconductor device 100 uses one second photosensitive layer 70 to form the deep trench 13 (FIG. 7), the semiconductor device 400 uses one second photosensitive layer (not illustrated) with respect to the first deep trench portion 413a and another second photosensitive layer (not illustrated) with respect to the second deep trench portion 413b. By way of example, the first deep trench portion 413a may be formed first by using one second photosensitive layer and then the second deep trench portion 413b may be formed by using the other second photosensitive layer. The first deep trench portion 413a is filled with the one second photosensitive layer so as not to be etched further during the following process of forming the second deep trench portion 413b.

Similar to the semiconductor devices 100, 200, 300, the semiconductor device 400 includes slopes 481a, 481b inclined at an angle (α) approximately of 60° with respect to the bottom plane 412a of the shallow trench 412. For example, the angle (α) may be less or greater than 60° (e.g., 30°, 45°, 70°, 80° etc.), or, for example, between 30° and 80°.

Since the first dielectric material 480 having the angle (α) is formed in advance, excessive deposition of the second dielectric material 490 on the corners E1, E2 formed around the boundary between the shallow trench 412 and the deep trench 413 can be avoided. Accordingly, generation of a void within the shallow trench 412 due to excessive deposition of the second dielectric material 490 on the corners E1, E2 due to the arch-shaped blocking films formed in the interspaces between E1 and E2 during charging of the second dielectric material 490 can be prevented.

The semiconductor device 400 includes the deep trench 413 having the first and the second trench portions 413a, 414b with different depths and thus provides increased breakdown voltage. That is, if applied to the structure which includes active regions with low operating voltages (e.g., a range from 1 V to 100 V) on the side of the first deep trench portion 413a and active regions with relatively higher operating voltages (e.g., a range from 100 V to 1000 V) on the side of the second deep trench portion 413b, the semiconductor device 400 provides an increased breakdown voltage between the low voltage regions and high voltage regions.

According to teachings above, there is provided a hard mask layer during forming of a shallow trench that may prevent a generation of notch near a bottom plane of a deep trench.

Further, according to teachings above, there is provided the shallow trench formed after the deep trench is formed, which may remove undercut and rough surfaces on an upper portion of the deep trench.

Further, according to teachings above, there is provided the shallow trench within which generation of a void during charging of a multi-depth trench with a second dielectric material may be prevented by first charging a first dielectric material with a sloping angle with respect to the shallow trench of the multi-depth trench and sidewalls and the bottom plane of the deep trench of the multi-depth trench, and then charging the second dielectric material into remaining areas of the multi-depth trench.

As a result, according to teachings above, there is provided a semiconductor device having more stabilized operation characteristics by preventing defects including notch, undercut, rough surfaces, or void.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a semiconductor device, the method comprising:
   forming a multi-depth trench in a semiconductor substrate, the forming of the multi-depth trench comprising:
      forming a shallow trench; and
      forming a deep trench arranged below the shallow trench;
   depositing a first dielectric material into a partial area of the multi-depth trench comprising the shallow trench and the deep trench, the deposited first dielectric material forming a slope in the shallow trench that extends upward from a corner where a horizontal bottom surface of the shallow trench and a vertical sidewall of the deep trench meets, the slope being inclined with respect to the horizontal bottom surface of the shallow trench; and
   depositing a second dielectric material into areas of the multi-depth trench in which the first dielectric material is absent.

2. The method of claim 1, further comprising:
   planarizing an upper surface of the second dielectric material using chemical mechanical planarization (CMP).

3. The method of claim 1, wherein the slope has an angle ranging between 30° and 80° with respect to the horizontal bottom surface of the shallow trench.

4. The method of claim 1, wherein:
   the first dielectric material is deposited by high density plasma chemical vapor deposition (HDP CVD) in the depositing of the first dielectric material; and
   the second dielectric material is deposited by low pressure chemical vapor deposition (LP CVD) in the depositing of the second dielectric material.

5. The method of claim 1, wherein the first dielectric material and the second dielectric material are silicon oxide.

6. The method of claim 1, wherein the forming of the multi-depth trench further comprises:
   forming a first hard mask layer on a surface of the semiconductor substrate, the forming of the first hard mask layer comprising:
      forming a pad oxide layer on the surface of the semiconductor substrate; and
      forming a pad nitride layer on the pad oxide layer;
   forming a second through hole, comprising etching the first hard mask layer;
   forming the deep trench, comprising first etching the semiconductor substrate; and
   forming the shallow trench, comprising second etching the semiconductor substrate according to the second through hole.

7. The method of claim 6, wherein the forming of the second through hole further comprises:
   forming a first photosensitive layer on the first hard mask layer;

forming a first through hole in the first photosensitive layer using a photolithographic process;

performing the etching of the first hard mask layer according to the first through hole to form the second through hole; and removing the first photosensitive layer.

8. The method of claim 6, wherein the forming of the deep trench further comprises:

depositing a second hard mask layer on the first hard mask layer;

coating a second photosensitive layer on the second hard mask layer;

forming a third through hole in the second photosensitive layer using a photolithographic process;

performing the first etching of the semiconductor substrate according to the third through hole to form the deep trench; and removing the second photosensitive layer and the second hard mask layer in sequence.

9. The method of claim 8, wherein the second hard mask layer is a silicon oxide layer.

10. The method of claim 1, wherein:

the first dielectric material and the second dielectric material are charged into the multi-depth trench by chemical vapor deposition (CVD);

the first dielectric material is charged by repeating a first deposition process and a first etching process; and the second dielectric material is charged only by a second deposition process.

11. The method of claim 10, wherein the first deposition process is carried out by high density plasma (HDP) CVD using monosilane ($SiH_4$) and oxygen ($O_2$) gases.

12. The method of claim 10, wherein the first etching process is carried out by an argon sputtering process.

13. A method of fabricating a semiconductor device, the method comprising:

obtaining a multi-depth trench in a semiconductor substrate by forming a first trench and forming a shallow trench at an upper portion of the first trench such that a lower portion of the first trench forms a deep trench arranged below the shallow trench;

depositing a first dielectric material into a partial area of the obtained multi-depth trench, the deposited first dielectric material forming a slope in the shallow trench that extends upward from a corner where a horizontal bottom surface of the shallow trench and a vertical sidewall of the deep trench meets, the slope being inclined with respect to the horizontal bottom surface of the shallow trench; and depositing a second dielectric material into areas of the multi-depth trench in which the first dielectric material is absent.

* * * * *